United States Patent [19]

Staebler

[11] 4,371,738
[45] Feb. 1, 1983

[54] METHOD OF RESTORING DEGRADED SOLAR CELLS

[75] Inventor: David L. Staebler, Lawrenceville, N.J.

[73] Assignee: RCA Corporation, New York, N.Y.

[21] Appl. No.: 260,170

[22] Filed: May 4, 1981

[51] Int. Cl.³ .............................................. H01L 31/18
[52] U.S. Cl. .................................... 136/243; 136/258; 136/290
[58] Field of Search ................ 136/290, 258 AM, 243

[56] References Cited

U.S. PATENT DOCUMENTS

| | | | |
|---|---|---|---|
| 3,597,281 | 8/1971 | Webb | 136/245 |
| 4,142,195 | 2/1979 | Carlson et al. | 357/15 |
| 4,237,150 | 12/1980 | Wiesmann | 427/74 |
| 4,291,318 | 9/1981 | Sansregret | 357/2 |

Primary Examiner—Aaron Weisstuch
Attorney, Agent, or Firm—Birgie E. Morris; Donald S. Cohen; William J. Burke

[57] ABSTRACT

Amorphous silicon solar cells have been shown to have efficiencies which degrade as a result of long exposure to light. Annealing such cells in air at a temperature of about 200° C. for at least 30 minutes restores their efficiency.

2 Claims, 2 Drawing Figures

METHOD OF RESTORING DEGRADED SOLAR CELLS

The government of the United States of America has rights in this invention pursuant to Department of Energy Contract No. EG-77-C-01-4042

BACKGROUND OF THE INVENTION

The present invention relates to solar cells. In particular, the invention relates to a method for restoring the efficiency of solar cells whose efficiency has degraded.

Within the past few years, large scale efforts have been made to manufacture photovoltaic solar cells in order that they may be used to produce power. In particular, one type of solar cell is the amorphous silicon solar cell of the type described in U.S. Pat. No. 4,064,521 entitled SEMICONDUCTOR DEVICE HAVING A BODY OF AMORPHOUS SILICON which issued to D. E. Carlson on Dec. 20, 1977; U.S. Pat. No. 4,142,195 entitled SCHOTTKY BARRIER SEMICONDUCTOR DEVICE AND METHOD OF MAKING SAME which issued to D. E. Carlson et al. on Feb. 27, 1979; U.S. Pat. No. 4,163,677 entitled SCHOTTKY BARRIER AMORPHOUS SILICON SOLAR CELL WITH THIN DOPED REGION ADJACENT METAL SCHOTTKY BARRIER which issued to D. E. Carlson et al. on Aug. 7, 1979; U.S. Pat. No. 4,196,438 entitled ARTICLE AND DEVICE HAVING AN AMORPHOUS SILICON CONTAINING A HALOGEN AND METHOD OF FABRICATION which issued to D. E. Carlson on Apr. 1, 1980; and U.S. Pat. No. 4,167,015 entitled CERMET LAYER FOR AMORPHOUS SILICON SOLAR CELLS which issued to J. J. Hanak on Sept. 4, 1979. Each of the foregoing U.S. patents is incorporated herein by reference.

Experience with the amorphous silicon solar cells of the type described in the foregoing U.S. patents has indicated that the efficiency of such cells will often degrade following a long exposure of the cells to light. In view of the fact that the intended application of solar cells involves their exposure to light, the degradation effect noted is an unfortunate one. Researchers in the field of manufacturing amorphous silicon solar cells theorize that the lack of cell stability and degradation results from a change in the intrinsic layer of the amorphous silicon body, which is typically comprised of a P-I-N or an N-I-P structure. The theory is that the degradation is caused by trapping or recombination of optically generated free carriers which results either from a decrease in carrier lifetime or from a field distortion affect resulting from a build-up of positive space charge in the intrinsic layer adjacent the N-layer of the cell. While the source of the degradation is not yet well known or understood, a method to eliminate the degradation would be desirable.

SUMMARY OF THE INVENTION

Amorphous silicon solar cells which have been degraded through exposure to light can be restored by heating them. While it has been found that an anneal at 100° C. will serve to only partially restore a cell, even after annealing for a long time, an anneal at about 200° C. will completely restore a cell in only 30 to 45 minutes.

DETAILED DESCRIPTION OF A PREFERRED EMBODIMENT

Figure 1:
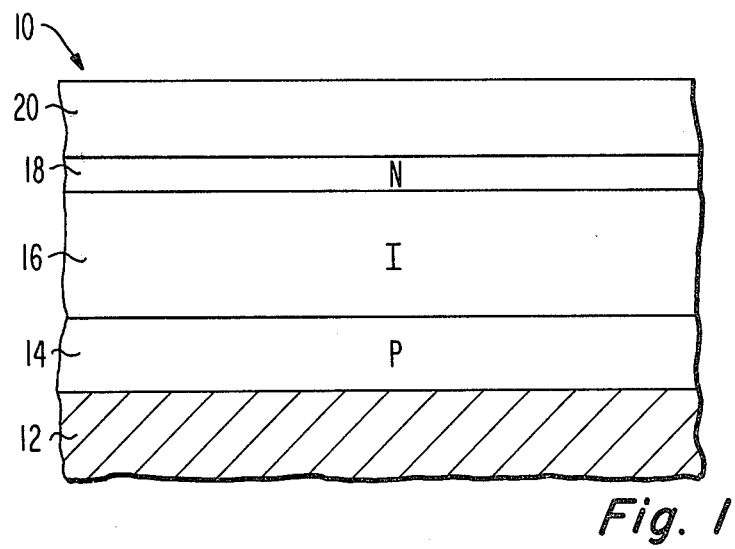
FIG. 1 is a side view of an amorphous silicon solar cell of the type on which the present invention is practiced.

Referring to FIG. 1, an amorphous silicon solar cell 10 of the type used in conjunction with the present invention, is shown. While the cell 10 is illustrative of one embodiment of an amorphous silicon solar cell with which the present invention can be used, it is by no means representative of all of the types of amorphous silicon solar cells, and many more types are described in detail in the U.S. patents identified above. Generally, an amorphous silicon solar cell contains an N type region and a P type region, and there is an intrinsic region therebetween. However, in many examples of amorphous silicon solar cells, a Schottky barrier is used instead of a P type region. In addition, the cells are typically formed on either a glass substrate having a layer of transparent, conductive material formed thereon, i.e. an indium tin oxide (ITO) layer, or on a stainless steel substrate, in which case ITO is typically used to form the upper, exposed contact to the solar cell.

Referring now to FIG. 1, the amorphous silicon solar cell 10 comprises a stainless steel substrate 12 having a layer of about 300 angstroms of P type amorphous silicon 14 formed thereon. Overlying the P type layer 14 is approximately 0.5 micrometers of an intrinsic layer 16, and over the intrinsic layer 16 is an N type layer 18 having a thickness of about 100 angstroms. Finally, an ITO transparent contact 20 overlies the N type layer 18. The cell 10 is a typical amorphous silicon solar cell having an efficiency on the order of about 5.5%.

Figure 2:
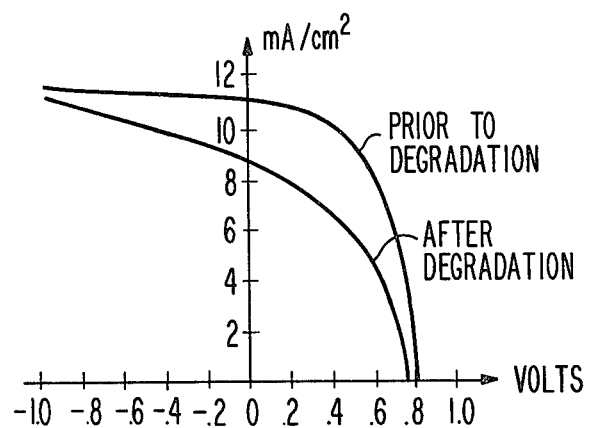
FIG. 2 is a set of I-V curves which show the type of degradation which an amorphous silicon solar cell, such as the one illustrated in FIG. 1, can exhibit when subjected to light.

Referring to FIG. 2, the voltage and current curve of the cell 10, prior to degradation and subsequent to degradation, is shown.

While some cells remain stable, other cells are very unstable in that their efficiency will drop to about 3% after only a few days exposure to AM1 light. As shown in FIG. 2, the fill factor and short circuit current are highly susceptible to changes, whereas the saturation current and reverse bias current typically remain more stable.

The inventor has discovered that heating the cell in air at about 100° C. will only partially restore the efficiency of the cell, even after about 15 hours of anneal time. However, if the cell is placed in an oven heated to about 200° C. its efficiency will be restored in about 30 to 45 minutes. Accordingly, the inventor has concluded that a degraded amorphous silicon solar cell can be restored by a heat treatment conducted at a temperature of greater than about 100° C., and preferably about 200° C.

The inventor has discovered, also, that the degradation restoration cycle is repeatable, i.e. cells may be cycled from degradation to restoration without any sign of fatigue.

It is claimed:

1. A process for restoring the efficiency of an amorphous silicon solar cell, said process comprising annealing the solar cell, whose efficiency has been degraded by long exposure to light, in air at a temperature greater than 100° C.

2. The method of claim 1 wherein said anneal temperature is about 200° C.

* * * * *